US010930831B2

(12) United States Patent
Chou et al.

(10) Patent No.: US 10,930,831 B2
(45) Date of Patent: Feb. 23, 2021

(54) LIGHT EMITTING CHIP AND FABRICATION METHOD THEREOF

(71) Applicant: High Power Opto, Inc., Taichung (TW)

(72) Inventors: Li-Ping Chou, Taichung (TW); Wan-Jou Chen, Taichung (TW); Wei-Yu Yen, Taichung (TW)

(73) Assignee: High Power Opto, Inc., Taichung (TW)

( * ) Notice: Subject to any disclaimer, the term of this patent is extended or adjusted under 35 U.S.C. 154(b) by 124 days.

(21) Appl. No.: 16/137,060

(22) Filed: Sep. 20, 2018

(65) Prior Publication Data
US 2020/0020837 A1 Jan. 16, 2020

(30) Foreign Application Priority Data
Jul. 10, 2018 (TW) ................................. 107123801

(51) Int. Cl.
*H01L 33/22* (2010.01)
*H01L 33/62* (2010.01)
*H01L 33/36* (2010.01)
*H01L 33/00* (2010.01)
H01L 29/866 (2006.01)

(52) U.S. Cl.
CPC .......... *H01L 33/62* (2013.01); *H01L 33/0075* (2013.01); *H01L 33/36* (2013.01); *H01L 29/866* (2013.01)

(58) Field of Classification Search
CPC ................................. H01L 33/22; H01L 33/24
See application file for complete search history.

(56) References Cited

U.S. PATENT DOCUMENTS

2019/0326473 A1* 10/2019 Choi ....................... H01L 33/22

FOREIGN PATENT DOCUMENTS

| TW | 201240135 A1 | 10/2012 |
|---|---|---|
| TW | 201349576 A | 12/2013 |

* cited by examiner

*Primary Examiner* — Moazzam Hossain
*Assistant Examiner* — Hajar Kolahdouzan

(57) ABSTRACT

The invention provides a light emitting chip comprising a conductive carrier, a semiconductor layer body having a first semiconductor layer, a second semiconductor layer, and a radiation emitting layer, wherein the semiconductor layer has a concave part extending from the surface of the first semiconductor layer through the radiation emitting layer toward the second semiconductor layer; a first electrical connection layer electrically connected between the first semiconductor layer and the first electrode; a second electrical connection layer electrically connected between the second semiconductor layer and the conductive carrier, wherein the second electrical connection layer includes a continuous electrode structure connected to the second semiconductor layer, the continuous electrode structure being constituted by at least a frame structure distributed at the edge of the light emitting chip; and a second electrode electrically connected to the conductive carrier.

5 Claims, 5 Drawing Sheets

LIGHT EMITTING CHIP AND FABRICATION METHOD THEREOF

FIELD OF THE INVENTION

The invention relates to a light-emitting semiconductor device, and more particularly to a light emitting diode (LED) chip.

BACKGROUND OF THE INVENTION

LED is a luminescent light-emitting element whose principle of luminescence is to apply a forward bias (current) on a III-V compound semiconductor material, and combines electrons and holes in a dipole to convert energy into light. It glows when it comes out, and it won't burn like an incandescent bulb for a long-time use. The advantages of the light-emitting diode are small volume, long life, low driving voltage, fast reaction rate, and excellent shock resistance. It can meet the needs of light, thin and miniaturized various devices, and has become a very popular product in daily life. To enable the light-emitting diode to emit white light, the phosphor powder is used to generate other colors of lights and then the lights are mixed, which is the current mainstream mode, and in order to avoid electrode interference with the application of the phosphor powder, the N-type semiconductor layer and the negative electrode are often connected by a plurality of penetrating electrodes for supplying a voltage required for the N-type semiconductor layer, and the surface of the N-type semiconductor layer directly serves as a light-emitting surface. Therefore, no electrode is provided on the light-emitting surface, and the problem that the electrode interferes with the coating of the phosphor powder is avoided. However, in such type of structures, the corresponding regions of the plurality of penetrating electrodes will reduce the effective light-emitting area of the light-emitting layer, thereby reduce the luminous efficiency, and the light emission at the edges thereof is relatively uneven.

The information disclosed in this "BACKGROUND OF THE INVENTION" Section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention was acknowledged by a person of ordinary skill in the art.

SUMMARY OF THE INVENTION

The invention provides a light emitting chip, which includes a conductive carrier; a semiconductor layer body, disposed at a side of the conductive carrier, comprising a first semiconductor layer, a second semiconductor layer, and a radiation emitting layer for generating electromagnetic radiation, wherein the radiation emitting layer is sandwiched between the first semiconductor layer and the second semiconductor layer, the second semiconductor layer is disposed at a side of the radiation emitting layer departing from the conductive carrier, and the semiconductor layer body comprises a concave part extending from a surface of the first semiconductor layer and penetrating through the radiation emitting layer; a first electrode; a first electrical connection layer; electrically connected between the first semiconductor layer and the first electrode; a second electrical connection layer electrically connected between the second semiconductor layer and the conductive carrier and extending from the conductive carrier to the second semiconductor layer via the concave part, wherein the second electrical connection layer comprises a continuous electrode structure connected with the second semiconductor layer, and the continuous electrode structure is constructed by at least a frame structure disposed at an edge of the light emitting chip; and a second electrode, electrically connected to the conductive carrier.

In one embodiment of the invention, the continuous electrode structure further includes at least a strip structure connected to the frame structure and extending into an interior of the conductive carrier.

In one embodiment of the invention, the second electrical connection layer further includes a bottom layer structure, connected between the continuous electrode structure and the conductive carrier.

In one embodiment of the invention, the first electrical connection layer is disposed between the semiconductor layer body and the conductive carrier.

In one embodiment of the invention, the first electrical connection layer is a mirror protective layer.

In one embodiment of the invention, the light emitting chip further includes a mirror ohmic contact layer, disposed between the mirror protective layer and the first semiconductor layer, and providing an ohmic contact between the mirror protective layer and the first semiconductor layer.

The invention further provides a light emitting chip manufacturing method, includes steps of forming a semiconductor layer body, wherein the semiconductor layer body comprises a first semiconductor layer, a second semiconductor layer, and a radiation emitting layer sandwiched between the first semiconductor layer and the second semiconductor layer; etching the semiconductor layer body for forming a concave part which is continuously distributed, wherein the concave part extends form the first semiconductor layer and penetrates through the radiation emitting layer, and the concave part is disposed on at least an edge of the light emitting chip; forming a first electrical connection layer on the semiconductor layer body, wherein the first electrical connection layer is electrically connected to the first semiconductor layer; forming a second electrical connection layer, wherein the second electrical connection layer comprises a continuous electrode structure forming on the concave part; and forming a first electrode and a second electrode, electrically connected to the first electrical connection layer and the second electrical connection layer, respectively.

In one embodiment of the invention, the continuous electrode structure further includes at lease a strip structure disposed within the concave part, wherein the strip structure is connected to the frame structure and extends into an interior of the light emitting chip.

In one embodiment of the invention, steps for forming the second electrical connection layer includes forming the continuous electrode structure within the concave part, wherein the continuous electrode structure is electrically connected to the second semiconductor layer on a bottom side of the concave part; and forming a bottom layer structure on the continuous electrode structure.

In one embodiment of the invention, the first electrical connection layer is a mirror protective layer.

In one embodiment of the invention, the light emitting chip manufacturing method further includes a step of forming a mirror ohmic contact layer disposed between the mirror protective layer and the first semiconductor layer for provide an ohmic contact between the mirror protective layer and the first semiconductor layer.

In one embodiment of the invention, the light emitting chip manufacturing method further includes a step of forming a conductive carrier on the second electrical connection layer after forming the second electrical connection layer.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The invention will become more readily apparent to those ordinarily skilled in the art after reviewing the following detailed description and accompanying drawings, in which.

DETAILED DESCRIPTION OF PREFERRED EMBODIMENTS

Figure 1:
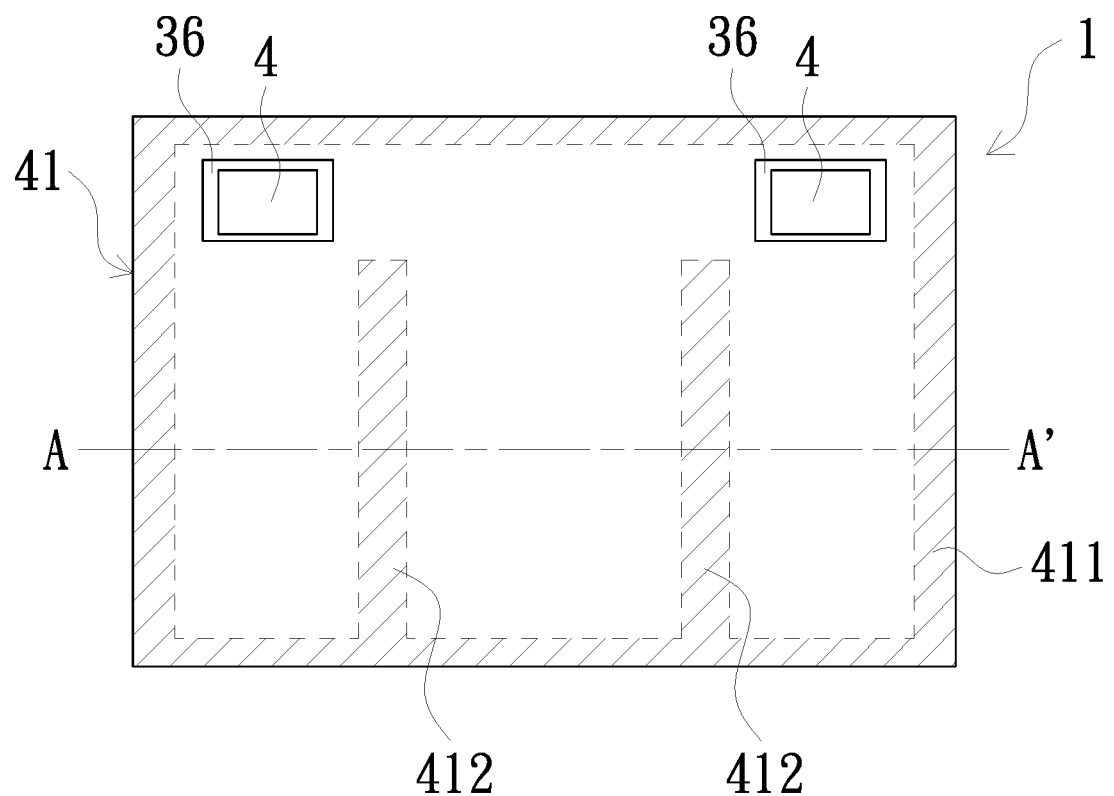
FIG. 1 is a top plan view of a light emitting chip in accordance with an embodiment of the present invention.
Figure 2:
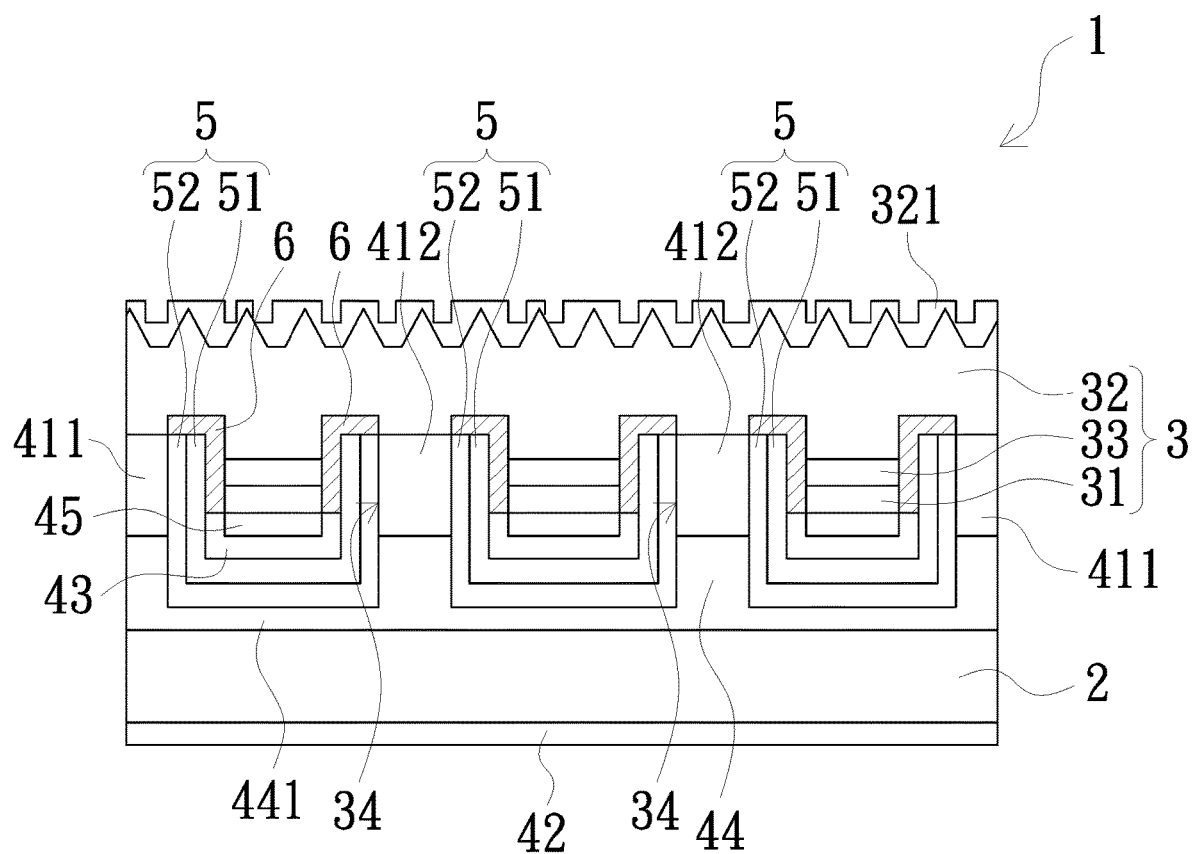
FIG. 2 is a cross-sectional view of the light emitting chip of FIG. 1 taken along line A-A'.

Please refer to FIG. 1, the light emitting chip 1 of the invention may be but is not limited to a LED, which may improve the above-mentioned problems by a continuous electrode structure 41 having a penetrating structure. The structure of the light emitting chip 1 is shown in FIG. 2, which includes a conductive carrier 2 and a semiconductor layer body 3. The semiconductor layer body 3 includes a first semiconductor layer 31, a second semiconductor layer 32, and a radiation emitting layer 33 for generating electromagnetic radiation. The first semiconductor layer 31 and the second semiconductor layer 32 may have different electrical properties. The radiation emitting layer 33 is sandwiched between the first semiconductor layer 31 and the second semiconductor layer 32 and thus forms a LED structure or the likes. The second semiconductor layer 32 is disposed on a side of the radiation emitting layer 33 departing from the conductive carrier 2. The semiconductor layer body 3 includes at least one concave part 34 extending from the first semiconductor layer 31 and penetrating through the radiation emitting layer 33. The semiconductor layer body 3 is connected to the first electrode 4 and the second electrode 42, wherein the first semiconductor layer 31 and the second semiconductor layer 32 are respectively electrically connected to the first electrode 4 and the second electrode 42 through the first electrical connection layer 43 and the second electrical connection layer 44, respectively. The second electrical connection layer 44, passing through the concave part 34, extends from the conductive carrier 2 toward the second semiconductor layer 32, and is electrically connected to the second semiconductor layer 32. In an embodiment, the first electrode 4 may be a positive electrode made of metal such as Cr, Pt, Au, etc., and is electrically connected to the first semiconductor layer 31, constructed by P-type epitaxial semiconductor, through the first electrical connection layer 43, which is made of metal such as Ti or Pt, etc. The second electrode 42 may be a negative electrode made of metal such as Ti, Pt, Au, etc., which is electrically connected to the second semiconductor layer 32 constructed by N-type epitaxial semiconductor, through the conductive carrier 2 made of Si and the second electrical connection layer 44.

Wherein, the second electrical connection layer 44 includes the continuous electrode structure 41, which is connected to the second semiconductor layer 32 and made of metal such as Cr, Pt, or Au, etc., and the bottom layer structure 441 made of metal such as Ti, Pt, Au or In, etc. The continuous electrode structure 41 is constructed by at least one of frame structure 411 distributed at the edge of the light emitting chip 1. The continuous electrode structure 41 may further includes at least one of strip structure 412, which is connected to the frame structure 411, and extends into the interior of the light emitting chip 1. The second electrical connection layer 44 is connected to the continuous electrode structure 41 and the conductive carrier 2.

In order to achieve the electrostatic discharge protection function, the light emitting chip 1 may selectively form thereon a Zener diode structure 5, which is spaced between the first electrical connection layer 43 and the second electrical connection layer 44, so that the first electrical connection layer 43 and the second electrical connection layer 44 are electrically dependent to each other. A partial structure of the Zener diode structure 5 is disposed in the current path between the first electrode 4 and the second electrode 42 as a circuit protection component. The Zener diode structure 5 includes the first electrical property semiconductor layer 51 and the second electrical property semiconductor layer 52. The first electrical property semiconductor layer 51 may be, but not limited to, an N-type semiconductor such as silicon-doped aluminum nitride (AlN:Si), phosphorous-doped silicon (Si:P), phosphorous-doped germanium (Ge:P), silicon carbide (SiC), or zinc oxide (ZnO), etc., is disposed on the side of the zener diode structure 5 facing the first electrical connection layer 43. The second electrical property semiconductor layer 52 may be, but is not limited to, a P-type semiconductor such as magnesium-doped aluminum nitride (AlN:Mg), boron-doped silicon (Si:B), boron-doped germanium (Ge:B), silicon carbide (SiC), or zinc oxide (ZnO), etc., is disposed on the side of the zener diode structure 5 facing the second electrical connection layer 44. The Zener diode structure 5 is disposed on the side of the second electrical connection layer 44 departing from the conductive carrier 2, connected to the second electrical connection layer 44, and extends toward the second semiconductor layer 32 along the second electrical connection layer 44 in the concave part 34.

The light emitting chip 1 may further include an insulation layer 6 disposed in the concave part 34 and electrically isolates the semiconductor layer body 3 from the Zener diode structure 5 and the continuous electrode structure 41. In one embodiment, the insulation layer 6 is a non-conductive passivated surface of the semiconductor layer body 3 that interfaces with the Zener diode structure 5. In another embodiment, the insulation layer 6 is composed of $SiO_2$, but the invention is not limited thereto.

The first electrical connection layer 43 is disposed on the side of the Zener diode structure 5 departing from the conductive carrier 2, and is in electrical contact with the first semiconductor layer 31 on the side of the first electrical connection layer 43 departing from the conductive carrier 2. The first electrical connection layer 43 is a mirror protective layer. The light emitting chip 1 further includes a mirror ohmic contact layer 45 disposed between the mirror protective layer (the first electrical connection layer 43) and the first semiconductor layer 31, and provides ohmic contact between the mirror protective layer and the first semiconductor layer 31. In an embodiment, the mirror ohmic contact layer 45 may be composed of metal such as Ag, TiW or Pt.

As with most semiconductor devices, when manufacturing the light emitting chip 1, a plurality of light emitting chips 1 are simultaneously fabricated in a plurality of closely connected regions planned on a wafer (not shown). After the fabrication is completed, the wafer is diced into individual dies and successively obtained by a package or the like to obtain a plurality of light emitting chips 1. In a manufacturing process embodiment of the light emitting chip of the invention, firstly, a buffer layer (not shown), the second semiconductor layer 32, the radiation emitting layer 33 and the first semiconductor layer 31 are sequentially grown by, for example, but not limited to, epitaxial, on a growth substrate (not shown) made of sapphire or silicon carbide. Wherein, the second semiconductor layer 32, the radiation emitting layer 33 and the first semiconductor layer 31 constitute a semiconductor layer body 3. The first semiconductor layer 31 and the second semiconductor layer 32 are respectively implanted with different electrical dopants, and the radiation emitting layer 33 is undoped.

Next, the concave part 34 is etched on the semiconductor layer main body 3 by a photolithography process. The concave part 34 extends from the first semiconductor layer 31 through the radiation emitting layer 33 in the vertical direction, and partial of the second semiconductor layer 32 is exposed at the bottom of the concave part 34. In the horizontal direction, the concave part 34 is a structure continuously distributed on the semiconductor layer body 3, and the concave part 34 is disposed on at least the edge area of the light emitting chip 1, and may further be disposed within at least one groove extending from the edge area to the interior of the light emitting chip 1. In one embodiment, the buffer layer, the second semiconductor layer 32, the radiation emitting layer 33, and the first semiconductor layer 31 may be made of u-GaN, n-GaN, undoped GaN, and p-GaN, respectively, but are not limited thereto. The radiation emitting layer 33 may be a multiple quantum well structure of InGaN/GaN, but is not limited thereto.

Next, an insulation layer 6 may be formed in the concave part 34 to electrically isolate the semiconductor layer body 3 from a Zener diode structure or a continuous electrode structure to be formed later. The formation of the insulation layer 6 may be plasma surface treated to form a passivated surface on the side surface and the bottom peripheral surface of the concave part 34. In another embodiment, the step of forming the insulating layer 6 includes depositing an insulating material such as silicon dioxide on the semiconductor layer body 3, and removing the excess insulating material by a photolithography process to make the surface of the first semiconductor layer 31 and the surface of the second semiconductor layer 32 at the bottom of the concave part 34 exposed.

Thereafter, metal such as Ag, TiW or Pt is sputtered, and a patterning process is applied to the metal layer to form a mirror ohmic contact layer 45 on the surface of the first semiconductor layer 31. Next, metal such as Ti or Pt is deposited, followed by a patterning process to form a first electrical connection layer 43 overlying the surface of the first semiconductor layer 31 and deposited with metal such as Au, Pt or Cr and associated patterning processes, on a portion of the second semiconductor layer 32, which is not covered by the insulating layer 6 at the bottom of the concave part 34, to form a continuous electrode structure 41 of the second electrical connection layer 44, including the frame structure 411 and the strip structure 412, both are electrically contacted with the second semiconductor layer 32.

Then, a first electrical property semiconductor layer 51 is formed on the first electrical connection layer 43 and in the concave part 34 by epitaxy and doping procedures. To form the Zener diode structure 5, the second electrical property semiconductor layer 52 is further formed on the first electrical property semiconductor layer 51 by epitaxy and doping procedures. The first electrical property semiconductor layer 51 and the second electrical property semiconductor layer 52 are doped with different electrical dopants. For example, in one embodiment, the first electrical property semiconductor layer 51 is P-type and the second electrical property semiconductor layer 52 is N-type. Thereafter, metal such as Ti, Pt, Au or In is sputtered over the Zener diode structure 5 to fill the concave part 34 and cover the surface of the second electrical property semiconductor layer 52 to form a bottom layer structure 441 of the second electrical connection layer 44. The bottom layer structure 441 of the second electrical connection layer 44 is in electrical contact with the continuous electrode structure 41 in the concave part 34 and constitutes a complete second electrical connection layer 44 with it. In this way, the Zener diode structure 5 having antistatic function is connected between the first electrical connection layer 43 and the second electrical connection layer 44 and spaces apart them, and makes both to be electrically dependent to each other.

The surface of the bottom layer structure 441 of the second electrical connection layer 44 is bonded to a material such as germanium to form a conductive carrier 2 such as a germanium wafer. The conductive carrier 2 can be implanted with the same electrical dopant as the second semiconductor layer 32 to facilitate electrical conduction between the second electrode 42 and the second semiconductor layer 32. Thereafter, a flipping operation can be performed to invert the entire device chip including the growth substrate (not shown) so that the orientation of the conductive carrier 2 and the growth substrate are interchanged, i.e., the growth substrate becomes at the top and the conductive carrier 2 is at the bottom. In one embodiment, the growth substrate and the buffer layer above the inverted device chip can be removed to expose the surface of the second semiconductor layer 32.

After the growth substrate is removed from the inverted device chip by peeling or grinding, and the buffer layer is etched by a plasma process, a portion of the semiconductor layer body 3 is removed by a patterning process to form a first electrode trench 36 as shown in FIG. 1. The surface of a portion of the first electrical connection layer 43 is exposed at the bottom of the first electrode trench 36. Next, the surface of the second semiconductor layer 32 is roughened, and metal such as Cr, Pt or Au is sputtered in the first electrode trench 36 to form a first electrode 4, and the roughened surface of the second semiconductor layer 32 is covered by the transparent silicon oxide (SiO$_2$) protective layer 321 as shown in FIG. 2. Further, metal such as Ti, Pt or Au is also sputtered on the lower surface of the conductive carrier 2 to form a second electrode 42. Finally, each of the dies on the wafer (not shown) is separated by laser cutting, and each of the dies is subjected to a packaging process to obtain a plurality of light emitting chips 1.

Figure 3:
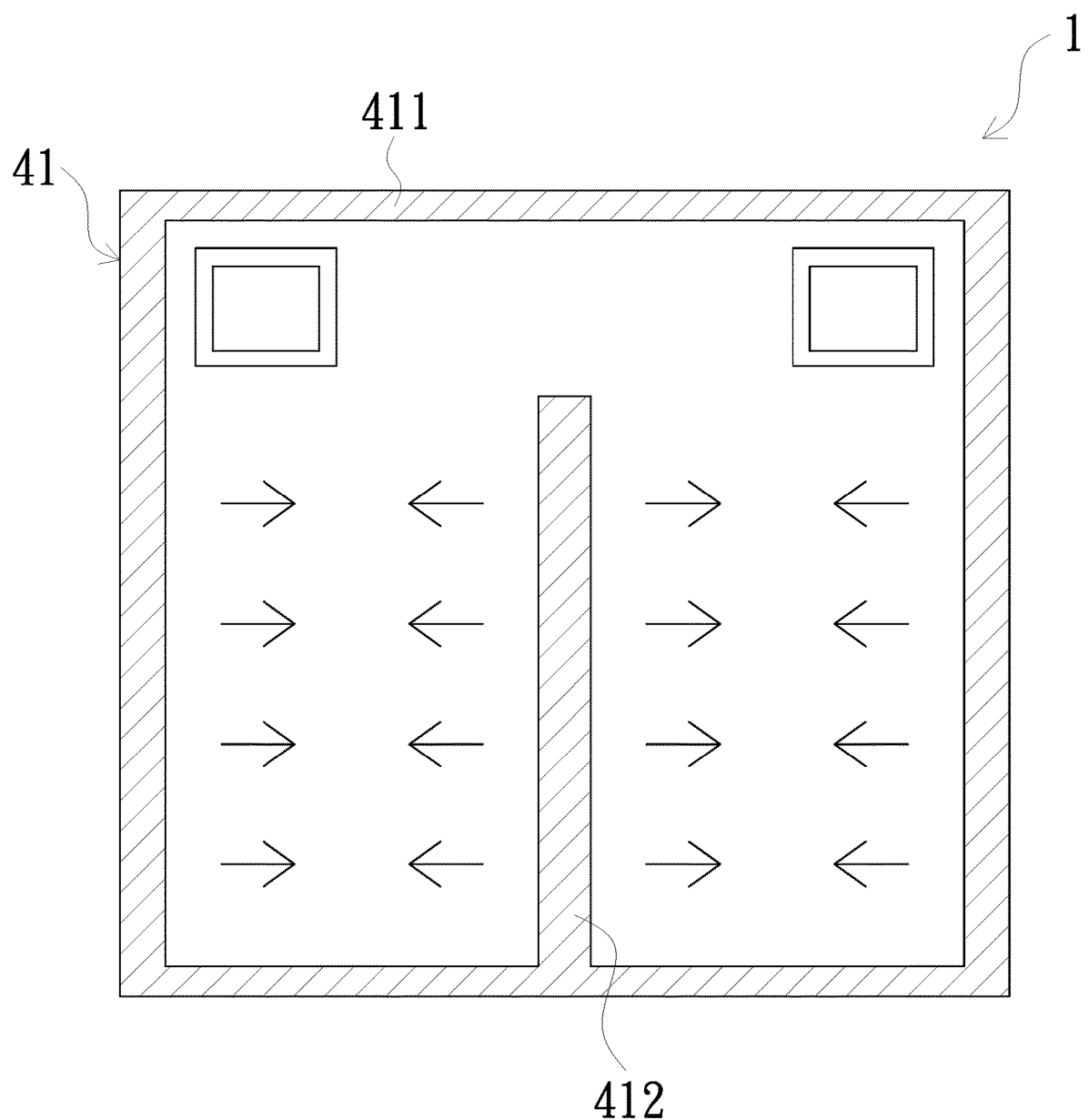
FIG. 3 is a schematic diagram of current spreading of a light emitting chip according to another embodiment of the present invention.
Figure 4:
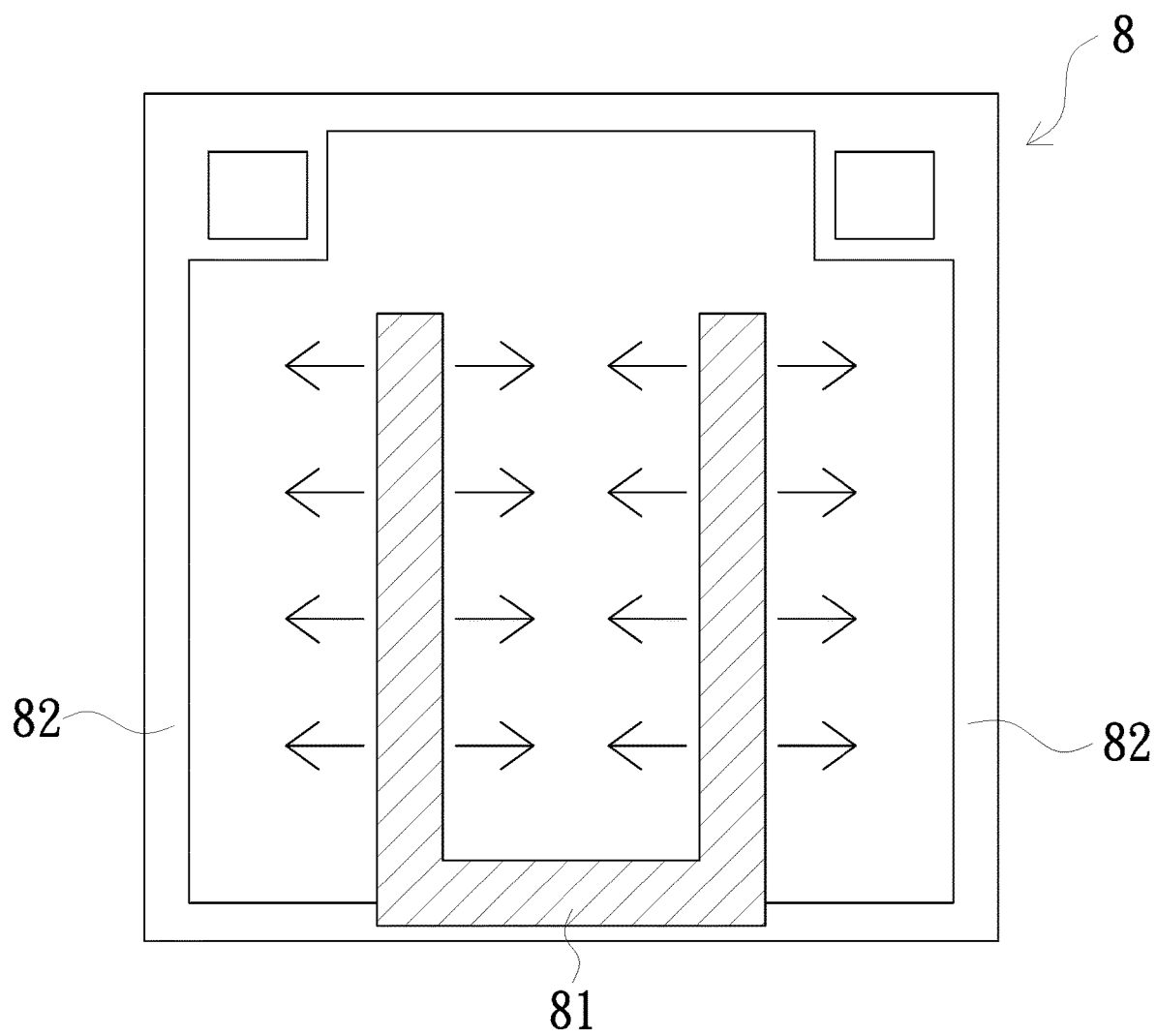
FIG. 4 is a schematic diagram of current spreading of a light emitting chip having no frame structure.

FIG. 3 and FIG. 4 compare a light emitting chip with and without a frame structure. The structure of each portion of the light emitting chip 8 shown in FIG. 4 is substantially the same as that of the light emitting chip 1 shown in FIG. 3, except that the continuous electrode structure 81 of the light emitting chip 8 has only two strip structures extending from the edge region of the wafer without the frame structure 411 of the light emitting chip 1. First of all, the frame structure 411 is present such that the layers at the interfaces between the respective ones of the light emitting chips 1 on the wafer have the same polarity, for example, all of them are N-type. In this way, the laser cutting can be directly used to separate the crystal grains. Otherwise, if the laser cutting has a P/N overlap on the cut surface, the sintered material generated by the laser cutting will remain in the P/N interface, the P/N interface will be short-circuited through the sintered material when the component is energized, and the photoelectric characteristics and reliability of the component are affected. If there is no frame structure 411 of light emitting chip 8, the trench 82 must be formed as indicated by FIG. 4 at the edge of the light emitting chip 8 to perform laser cutting. Therefore, compared to the light emitting chip 8, the light emitting chip 1 can omit the isolation process between the chip boundaries due to the presence of the frame structure 411. Secondly, please refer to FIG. 2, since the continuous electrode is used instead of the trench 82, the trench 82 which is invalid for the illuminating characteristics becomes the continuous electrode for transmitting current, and thus further reduces the area of the first electrode required for the illuminating region. That is, in the light emitting chip 1, the area of the frame structure 411 plus the area of the strip structure 412 will be smaller than the area of the trench 82 plus the area of the continuous electrode structure 81. Therefore, for chips of the same size, the light emitting chip 1 has a larger light emitting area than that of the light emitting chip 8. Thirdly, since the current diffusivity on the semiconductor layer body 3 is related to the distance between the current carrier and the electrode, the closer to the electrode, the better the diffusivity. Please refer to the current spreading direction indicated by the arrows in FIG. 3 and FIG. 4, since the frame structure 411 shortens the distance between the current carrier and the electrode, the light emitting chip 1 has better current spreading than the light emitting chip 8.

Figure 5:
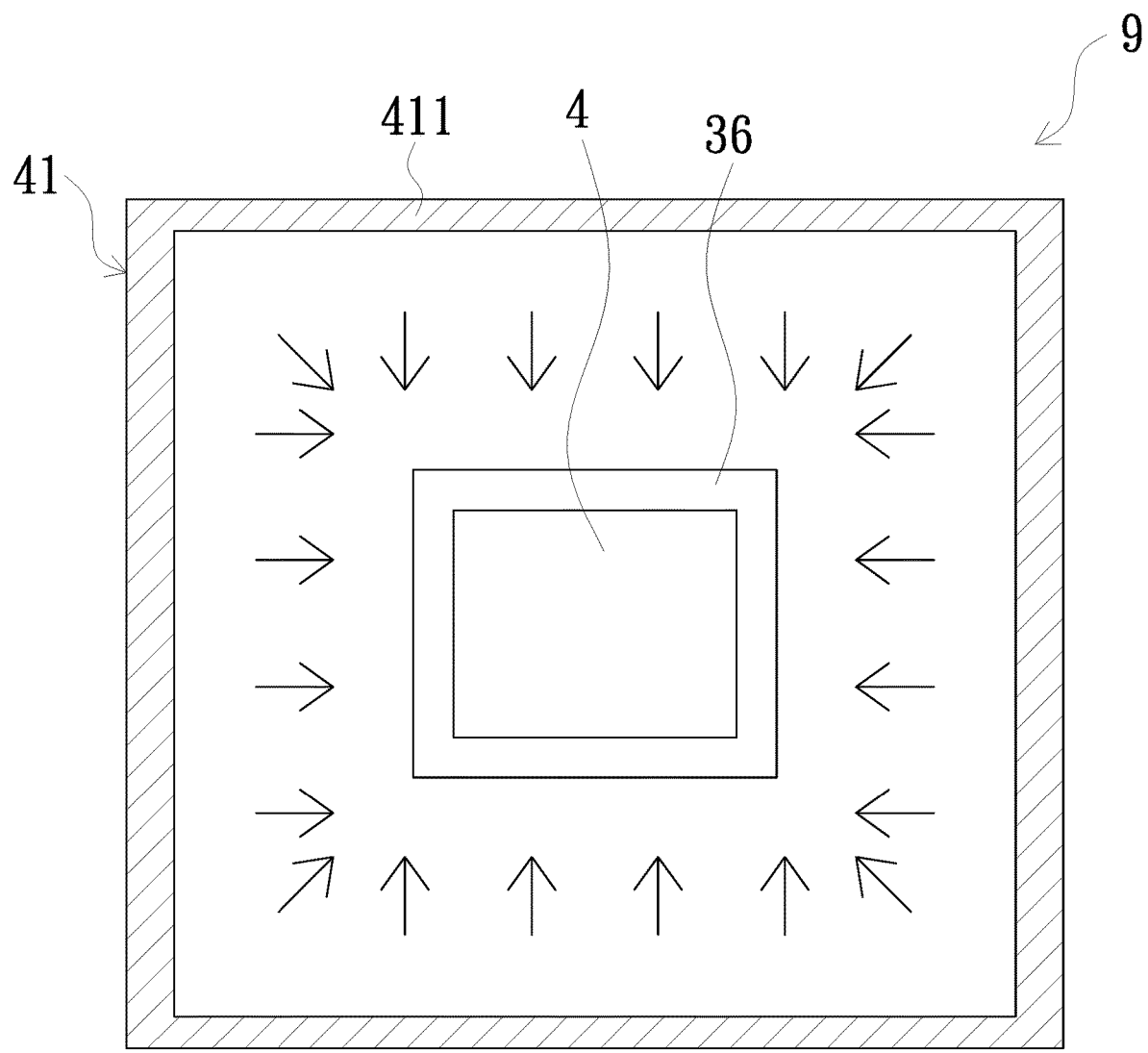
FIG. 5 is a schematic diagram of current spreading of a light emitting chip in accordance with yet another embodiment of the present invention.

The number and distribution positions of the strip structures shown in FIG. 1 and FIG. 3 are merely illustrative and are not intended to limit the invention. Further, the continuous electrode structure 41 shown in FIG. 1 and FIG. 3 is composed of a frame structure 411 and at least a strip structure 412. However, in various embodiments, as shown in FIG. 5, the continuous electrode structure 41 may also be constructed only for the frame structure 411 without the strip structure 412.

In summary, by using the continuous electrode structure 41 including the frame structure 411, the invention may reduce the number of strip structures 412, thereby improves the light-emitting area to improve the efficiency of the chip, and makes it possible to directly separate the crystal grains by using laser cutting without additional processes for defining the border partition, and the chip may have better current spreading. Accordingly, it has extremely excellent industrial value. While the present invention has been described above in terms of the preferred embodiments thereof, it is not intended to limit the invention, and the present invention may be modified and modified without departing from the spirit and scope of the invention. The scope of protection is subject to the definition of the scope of the patent application.

What is claimed is:
1. A light emitting chip, comprising:
a conductive carrier;
a semiconductor layer body, disposed at a side of the conductive carrier, comprising a first semiconductor layer, a second semiconductor layer, and a radiation emitting layer for generating electromagnetic radiation, wherein the radiation emitting layer is sandwiched between the first semiconductor layer and the second semiconductor layer, the second semiconductor layer is disposed at a side of the radiation emitting layer departing from the conductive carrier, and the semiconductor layer body comprises a concave part extending from a surface of the first semiconductor layer and penetrating through the radiation emitting layer;
a first electrode;
a first electrical connection layer; electrically connected between the first semiconductor layer and the first electrode;
a second electrical connection layer electrically connected between the second semiconductor layer and the conductive carrier and extending from the conductive carrier to the second semiconductor layer via the concave part, wherein the second electrical connection layer comprises a continuous electrode structure connected with the second semiconductor layer, and the continuous electrode structure is constructed by at least a frame structure disposed at an edge of the light emitting chip; and
a second electrode, electrically connected to the conductive carrier;
wherein the concave part is continuously extended in the semiconductor layer body along a horizontal structure parallel to the side of the conductive carrier which the semiconductor layer body is disposed on;
wherein the continuous electrode structure constructed by at least the frame structure is disposed in the concave part;
wherein the continuous electrode structure further comprises at least a strip structure connected to the frame structure and extending into an interior of the conductive carrier.

2. The light emitting chip according to claim 1, wherein the second electrical connection layer further comprises a bottom layer structure, connected between the continuous electrode structure and the conductive carrier.

3. The light emitting chip according to claim 1, wherein the first electrical connection layer is disposed between the semiconductor layer body and the conductive carrier.

4. The light emitting chip according to claim 3, wherein the first electrical connection layer is a mirror protective layer.

5. The light emitting chip according to claim 4, further comprises a mirror ohmic contact layer, disposed between the mirror protective layer and the first semiconductor layer, and providing an ohmic contact between the mirror protective layer and the first semiconductor layer.

\* \* \* \* \*